(12) United States Patent
Lee

(10) Patent No.: US 7,026,203 B2
(45) Date of Patent: Apr. 11, 2006

(54) METHOD FOR FORMING DUAL GATE ELECTRODES USING DAMASCENE GATE PROCESS

(75) Inventor: Sang Gi Lee, Bucheon-si (KR)

(73) Assignee: Dongbuanam Semiconductor Inc., Seoul (KR)

( * ) Notice: Subject to any disclaimer, the term of this patent is extended or adjusted under 35 U.S.C. 154(b) by 0 days.

(21) Appl. No.: 11/017,762

(22) Filed: Dec. 22, 2004

(65) Prior Publication Data
US 2005/0153493 A1 Jul. 14, 2005

(30) Foreign Application Priority Data
Dec. 31, 2003 (KR) .................. 10-2003-0101184
Dec. 31, 2003 (KR) .................. 10-2003-0101187

(51) Int. Cl.
*H01L 21/338* (2006.01)

(52) U.S. Cl. ..................... 438/183; 438/692

(58) Field of Classification Search ............ 438/142, 438/144–145, 149, 153, 157, 174, 176, 180–186, 438/197, 199, 230, 269–272, 275, 295, 522, 438/582, 587, 592, 595, 633, 655, 663, 685, 438/692, 719, 735, 742, 754
See application file for complete search history.

(56) References Cited

U.S. PATENT DOCUMENTS

| 6,043,157 | A | * | 3/2000 | Gardner et al. ............ 438/692 |
| 6,087,208 | A | * | 7/2000 | Krivokapic et al. ........ 438/183 |
| 6,514,827 | B1 |   | 2/2003 | Kim et al. |
| 6,580,137 | B1 |   | 6/2003 | Parke |
| 6,613,621 | B1 | * | 9/2003 | Uh et al. .................... 438/183 |
| 6,861,319 | B1 | * | 3/2005 | Hoshino et al. ............ 438/303 |

FOREIGN PATENT DOCUMENTS

WO WO 02/19396 A1 3/2002

* cited by examiner

*Primary Examiner*—Michael Lebentritt
*Assistant Examiner*—Andre' C. Stevenson
(74) *Attorney, Agent, or Firm*—Finnegan, Henderson, Farabow, Garrett & Dunner, L.L.P.

(57) ABSTRACT

A method for forming dual gate electrodes using a damascene gate process is disclosed. A disclosed method comprises: growing a first gate oxide layer on a semiconductor substrate; performing a thermal treatment for a first gate oxide layer; removing a predetermined part of the first gate oxide layer until the top surface of the semiconductor substrate is exposed; growing a second gate oxide layer as a thin oxide layer on the exposed semiconductor substrate, thereby making the first gate oxide layer as a thick oxide layer; depositing polysilicon on the entire surface of the semiconductor substrate and forming dummy gates through a photolithography and an etching processes; forming sidewall spacers on the lateral faces of the dummy gates; forming source and drain regions in the substrate under both sides of the dummy gates; removing the dummy gates and the second gate oxide layer; forming an insulating layer where the second gate oxide layer is removed; performing a thermal treatment for the insulating layer; filling polysilicon for gate electrodes where the dummy gates were removed; and planarizing the resulting structure until the gate electrodes are exposed.

8 Claims, 4 Drawing Sheets

METHOD FOR FORMING DUAL GATE ELECTRODES USING DAMASCENE GATE PROCESS

BACKGROUND OF THE INVENTION

1. Field of the Invention

The present disclosure relates generally to a semiconductor fabrication and, more particularly, to a method for forming dual gate electrodes using a damascene gate process.

2. Background of the Related Art

Threshold voltage deviation in sub-100 nm MOSFETs is a serious problem whose origins are considered to be the fluctuation of gate length, channel impurity density, work function of gate material, interface trap density, fixed charge density in gate oxide and gate oxide thickness, etc. The interface traps and the fixed charge are created during the plasma process such as RIE and ion implantation process. By fabricating gate electrodes after a source and drain region formation, plasma and thermal damage on the gate electrodes can be reduced. This is called the damascene gate process.

FIG. 1 is a cross-sectional view illustrating dual gate electrodes in accordance with a prior art. Steps for fabricating the dual gate electrodes shown in FIG. 1 are as follows. First, an STI (Shallow Trench Isolation) structure 150 is formed in a substrate 100. An N-well and a P-well are respectively formed in the substrate 100 by ion implantation processes. Subsequently, a thick gate oxide layer 180 and a thin gate oxide layer 190 are respectively formed on the substrate 100. An annealing process is then performed for the resulting structure under a $N_2$ atmosphere. In this step, the thin gate oxide layer 190 is relatively highly nitrided compared to the thick gate oxide layer 180, resulting in the deterioration of the characteristic of a semiconductor device.

Subsequently, dummy polysilicon is deposited on the entire surface of the substrate 100. After a photoresist pattern is formed on the dummy polysilicon by a common photolithography process, dummy gates are formed by an etching process. Subsequently, LDD structures 130 are respectively formed around each of the dummy gates by implanting low concentration ions. Spacers 160 made of nitride are then formed on the lateral faces of each of the dummy gates. Source and drain regions 140 with the LDD structures 130 are then respectively formed around the each of the dummy gates by implanting high concentration ions. Subsequently, a predetermined thermal treatment is performed to activate the ions in the source and drain regions 140 having the LDD structures 130. After the dummy gates are removed, another polysilicon 120 is deposited where the dummy gates are removed. A liner layer is formed on the each of the gate electrode. A CMP process is then performed to planarize the surface of the resulting structure. Subsequently, a silicide layer 170 is formed on the source and drain regions 140 with the LDD structures 130 and the top of polysilicon 120 of the gate electrodes. Dual gate electrodes are then completed.

Korean Patent Publication No. 2003-0,061,791 discloses the structure and fabrication process of a completely planar, damascene double gated transistor. The structure has a novel self-aligned, hyper-abrupt retrograde body and a zero-parasitic, endwall gate-body connection. The structure also provides for increased density and enables ultra low power to be utilized. The methods also provide for simultaneously making both four-terminal and dynamic threshold MOSFET devices.

However, conventional methods have several shortcomings as follows. First, the thin gate oxide layer may be easily contaminated by nitride impurities which are used in the annealing process for the thick gate oxide layer. Second, a stable thermal budget may be difficult to achieve because the gate oxide layer does not have a high dielectric constant.

SUMMARY OF INVENTION

An object of the present invention is to maintain stable thermal budget for optimum characteristics of a semiconductor device, and facilitate fabrication of high-voltage transistors of an input/output circuit.

To achieve these objects and other advantages and in accordance with the purpose of the invention, as embodied and broadly described herein, the present invention provides a method for fabricating dual gate electrodes comprising steps: growing a first gate oxide layer on a semiconductor substrate; performing a thermal treatment for a first gate oxide layer; removing a predetermined part of the first gate oxide layer until the top surface of the semiconductor substrate is exposed; growing a second gate oxide layer as a thin oxide layer on the exposed semiconductor substrate, thereby making the first gate oxide layer as a thick oxide layer; depositing polysilicon on the entire surface of the semiconductor substrate and forming dummy gates through a photolithography and an etching processes; forming sidewall spacers on the lateral faces of the dummy gates; forming source and drain regions in the substrate under both sides of the dummy gates; removing the dummy gates and the second gate oxide layer; forming an insulating layer where the second gate oxide layer is removed; performing a thermal treatment for the insulating layer; filling polysilicon for gate electrodes where the dummy gates were removed; and planarizing the resulting structure until the gate electrodes are exposed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

FIGS. 2 through 11 are cross-sectional views illustrating a dual gate electrode formation method in accordance with the present invention.

Figure 1:
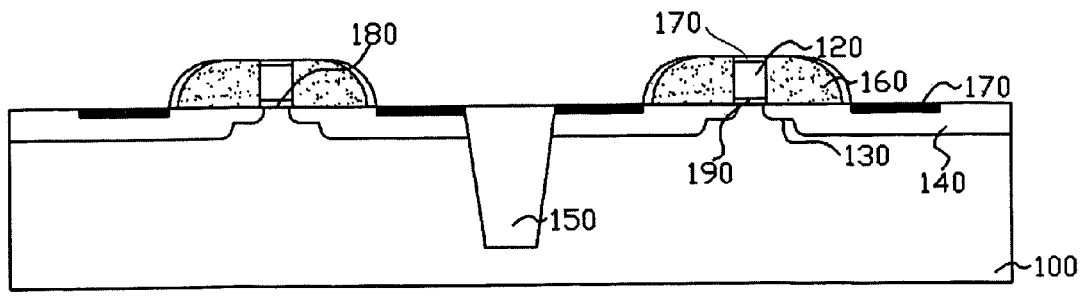
FIG. 1 is a cross-sectional view illustrating dual gate electrodes in accordance with a conventional method.
Figure 2:
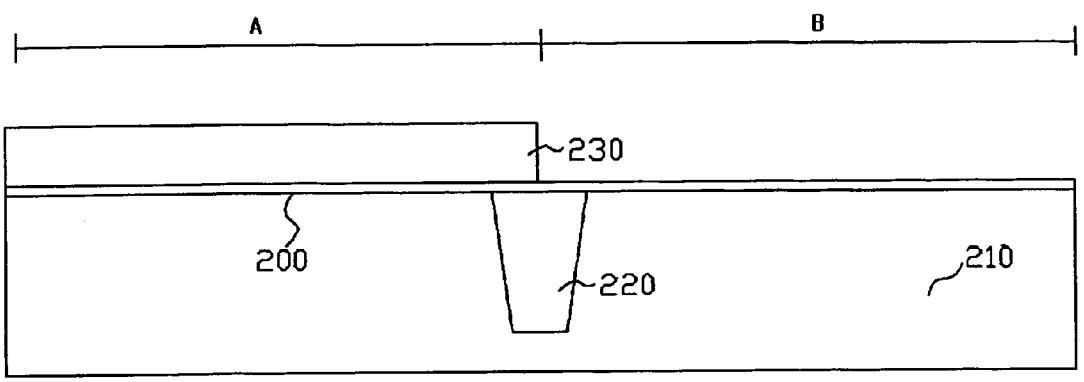
FIGS. 2 through 11 are cross-sectional views illustrating a dual gate electrode formation method in accordance with the present invention.

Referring to FIG. 2, an STI 220 is formed in a semiconductor substrate 210. Subsequently, an ion implantation process is performed to make a P-well or an N-well. A thick gate oxide layer 200 is then grown on the entire surface of the semiconductor substrate 210. Subsequently, a first thermal process is performed for the resulting structure. Preferably, the first thermal process may be performed under a $N_2$ atmosphere, infiltrating nitride into the thick gate oxide layer 200. A photoresist pattern 230 is then formed on the thick gate oxide layer 200 in the first gate region A by a common photolithography process.

Figure 3:
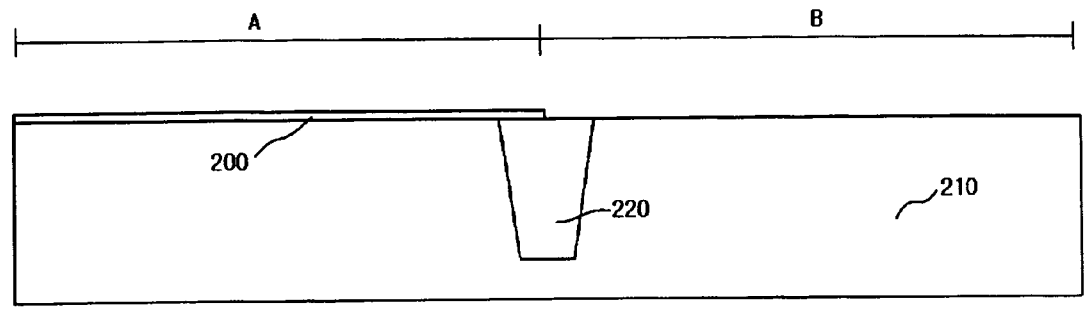

Referring to FIG. 3, the thick gate oxide layer 200 on a second gate region B is then etched by using the photoresist pattern 230. The photoresist pattern 230 on the first gate region A is then removed.

Figure 4:
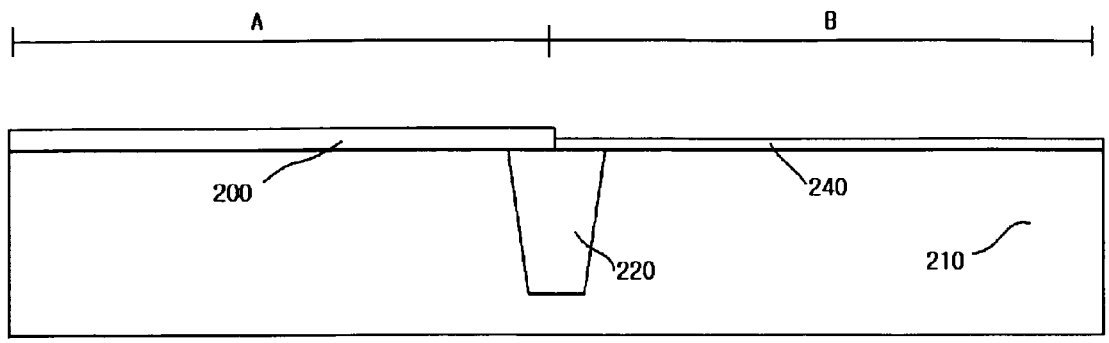

Referring to FIG. 4, a thin gate oxide layer 240 is grown on the semiconductor substrate in the second gate region B. Simultaneously, the thick gate oxide layer 200 on the first gate region A gets thicker.

Figure 5:
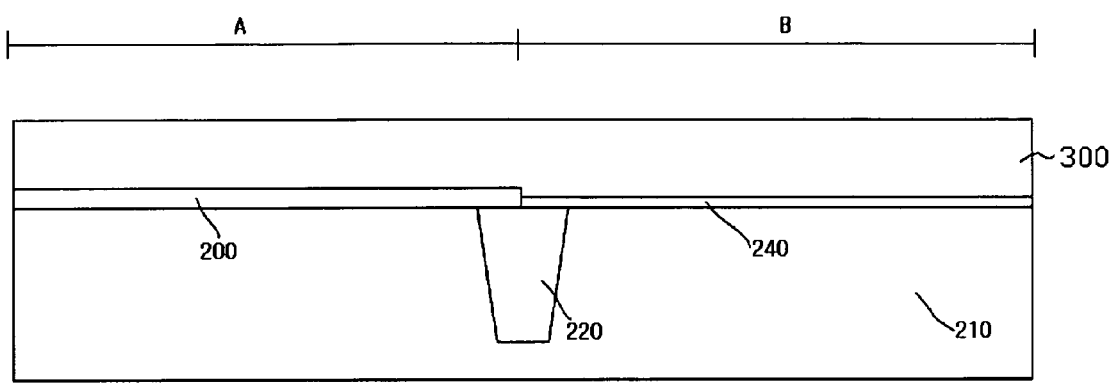

Referring to FIG. 5, a polysilicon layer 300 for dummy gates are formed on the entire surface of the semiconductor substrate 210.

Figure 6:
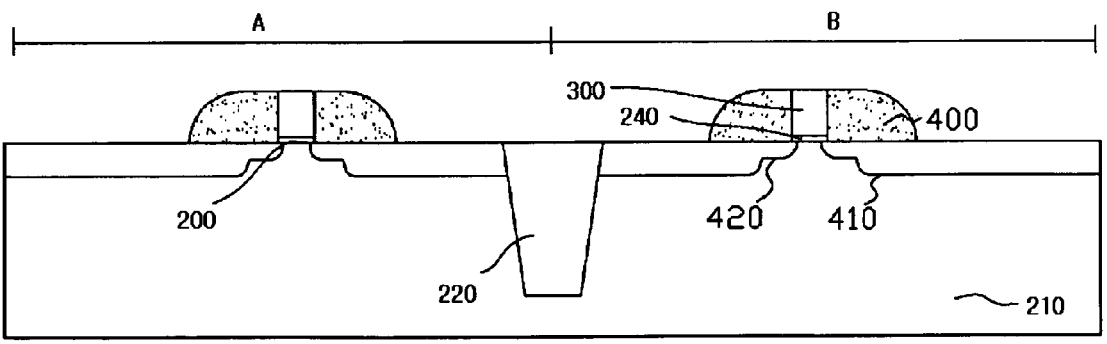

Referring to FIG. 6, after a photoresist pattern is formed by a photolithography process, dummy gates are respectively formed on the first gate region A and the second gate region B by a predetermined etching process, and the photoresist pattern is removed. Ions with low concentration are implanted to form LDD structures 420 into the semiconductor substrate 210 including both the first gate region A and the second gate region B. Here, the dummy gate are used as ion implantation masks. Subsequently, sidewall spacers 400 made of nitride are formed on the lateral faces of the dummy gates in the first gate region A and the second gate region B. Ions with high concentration are then implanted to form source and drain regions 410 in the substrate under both side of the dummy gates with the dummy gates and the sidewall spacers 400 as masks. Preferably, a second thermal process is then performed at a temperature about 800° C. to control the diffusion of the ions in the source and drain regions 410 and the LDD structures 420.

Figure 7:
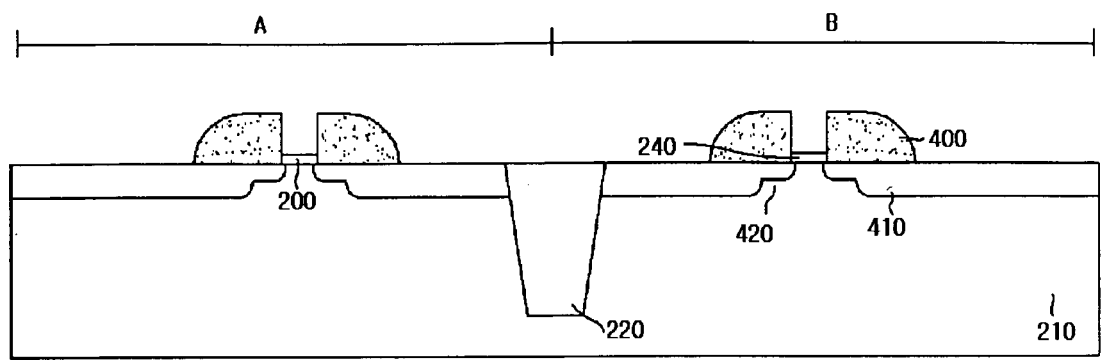

Referring to FIG. 7, the dummy gates of polysilicon in both the first gate region A and the second gate region B are removed.

Figure 8:
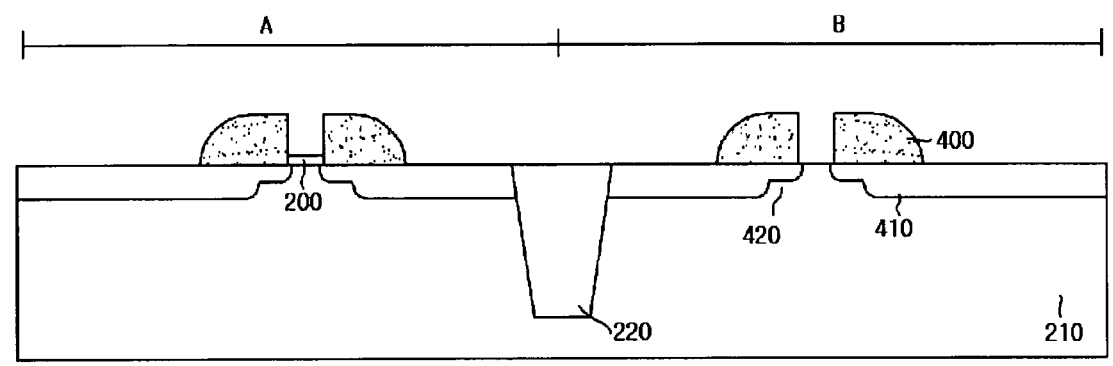

Referring to FIG. 8, the thin gate oxide layer 240 in the second gate region B is completely removed. Even after the removal of the thin gate oxide layer 240, the thick oxide layer 200 with a predetermined thickness remains on the first gate region A. Subsequently, a cleaning process is performed to remove residues on the surface of the resulting structure.

Figure 9:
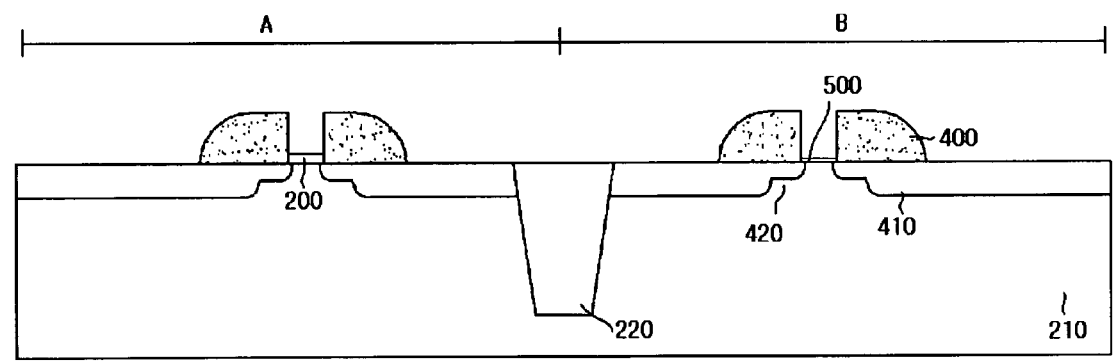

Referring to FIG. 9, an insulating layer 500 is formed between the sidewalls in the second gate region B. The insulating layer 500 may be made of silicon oxide. On the other hand, the insulating layer 500 may be made of a material having a high dielectric constant selected from the group consisting of $TaO_5$, $TiO_2$ and ITO (Indium Tin Oxide). In this case, a third thermal process is preferably performed at a temperature less than 600° C. The resulting insulating layer 500 in both cases preferably has a thickness equal to or thinner than that of the thick oxide layer 200.

Figure 10:
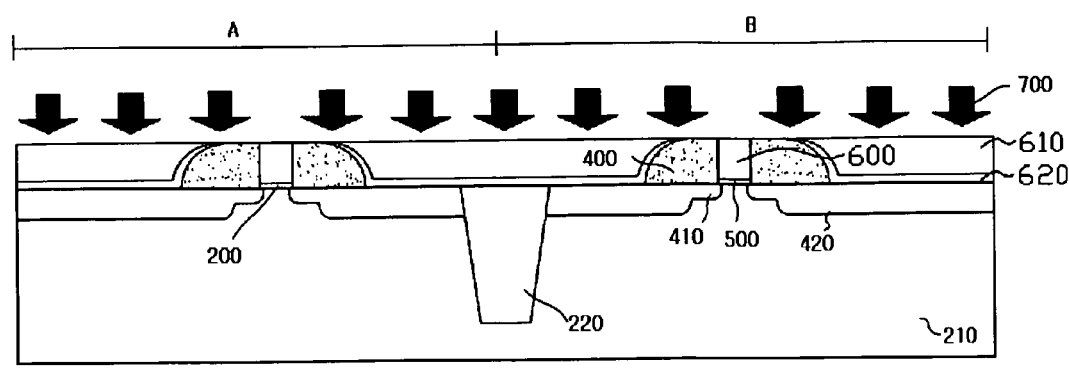

Referring to FIG. 10, polysilicon 600 for the dual gate electrodes is filled where the dummy gates were removed. A liner nitride layer 620 is then deposited on the entire surface of the resulting structure. Subsequently, PDM (Pre-Dielectric Material) 610 is deposited on the entire surface of the liner nitride layer 620 of the resulting structure. A CMP (Chemical Mechanical Polishing) process 700 is then performed until the polysilicon 600 of the dual gate electrodes is exposed. The PDM 610 and the liner nitride 620 except on the sidewall spacers 400 are removed by a wet etch.

Figure 11:
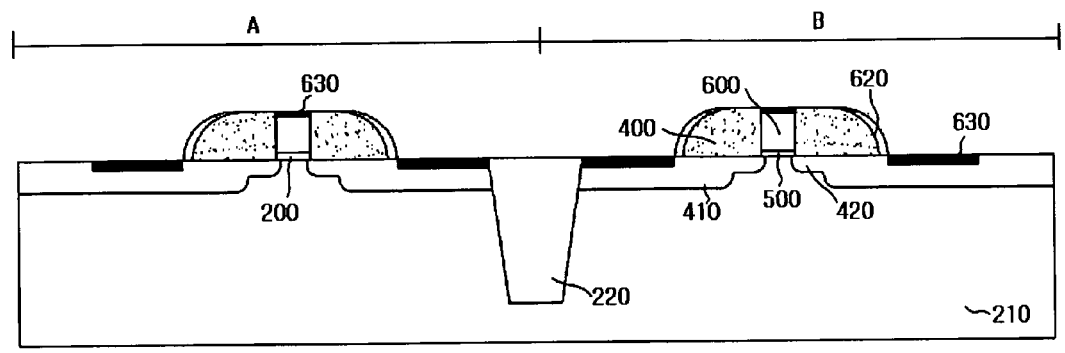

Referring to FIG. 11, a silicide layer 630 is formed on the source and drain regions 410 with the LDD structures 420 and on the dual gate electrodes in the first gate region A and the second gate region B.

Accordingly, the present invention provides a method for maintaining the stable thermal budget by depositing either a thin layer with the high dielectric constant or the pure oxide layer on one region through the damascene gate process, therefore fabricating the semiconductor device which has optimum characteristics. Simultaneously, by forming a thick oxide layer on the other region, characteristics such as a hot carrier are improved and, in addition, high-voltage transistors of an input/output circuit can be easily fabricated.

It is noted that this patent claims priority from Korean Patent Application Serial Number 10-2003-0101184 and 10-2003-0101187, which were filed on Dec. 31, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating dual gate electrodes comprising:

growing a first gate oxide layer on a semiconductor substrate;

performing a thermal treatment for the first gate oxide layer;

removing a part of the first gate oxide layer to expose a surface of the semiconductor substrate;

growing a second gate oxide layer as a thin oxide layer over the exposed surface of the semiconductor substrate and the first gate oxide layer;

depositing a polysilicon layer over the entire surface of the semiconductor substrate;

etching the polysilicon layer to form at least a first dummy gate on the first gate oxide layer and at least a second dummy gate on the second gate oxide layer;

forming sidewall spacers on the lateral faces of the first and second dummy gates;

forming source and drain regions in the semiconductor substrate on both sides of the first and second dummy gates;

removing the first and second dummy gates and the second gate oxide layer between the sidewall spacers;

forming an insulating layer where the second gate oxide layer is removed;

performing a thermal treatment for the insulating layer;

filling polysilicon for gate electrodes where the dummy gates are removed; and planarizing the polysilicon for gate electrodes to form gate electrodes.

2. A method as defined by claim 1, wherein the thermal treatment for the first gate oxide layer is performed under a $N_2$ atmosphere.

3. A method as defined by claim 1, wherein removing the second gate oxide layer accompanies removing a predetermined thickness of the first gate oxide layer.

4. A method as defined by claim 1, wherein the insulating layer is made of silicon oxide or a material with a high dielectric constant.

5. A method as defined by claim 4, wherein the material with a high dielectric constant is selected from the group consisting of $TaO_5$, $TiO_2$ and ITO.

6. A method as defined by claim 1, wherein the insulating layer is formed to have a thickness equal to that of the first gate oxide layer.

7. A method as defined by claim 1, wherein the thermal treatment for the insulating layer is performed at a temperature about 600°.

8. A method as defined by claim 1, wherein planarizing the polysilicon for gate electrodes comprises performing a CMP process.

* * * * *